US006310797B1

(12) United States Patent
Muneno

(10) Patent No.: US 6,310,797 B1
(45) Date of Patent: Oct. 30, 2001

(54) DRIVE METHOD FOR FERAM MEMORY CELL AND DRIVE DEVICE FOR THE MEMORY CELL

(75) Inventor: Hidehiro Muneno, Tsuchiura (JP)

(73) Assignee: Seiko Epson Corporation, Tokyo (JP)

(*) Notice: Subject to any disclaimer, the term of this patent is extended or adjusted under 35 U.S.C. 154(b) by 0 days.

(21) Appl. No.: 09/601,369

(22) PCT Filed: Nov. 30, 1999

(86) PCT No.: PCT/JP99/06717

§ 371 Date: Nov. 15, 2000

§ 102(e) Date: Nov. 15, 2000

(87) PCT Pub. No.: WO00/33316

PCT Pub. Date: Jun. 8, 2000

(30) Foreign Application Priority Data

Dec. 2, 1998 (JP) .................................................. 10-343084

(51) Int. Cl.[7] .................................................... G11C 11/22
(52) U.S. Cl. ........................................... 365/145; 365/149
(58) Field of Search ................................. 365/145, 149, 365/171, 173

(56) References Cited

U.S. PATENT DOCUMENTS

| 5,406,510 | * | 4/1995 | Mihara et al. | 365/145 |
| 5,517,445 | * | 5/1996 | Mihara et al. | 365/145 |
| 5,615,144 | * | 3/1997 | Kimura et al. | 365/145 |
| 5,671,174 | * | 9/1997 | Koike et al. | 365/145 |
| 5,959,922 | * | 9/1999 | Jung | 365/210 |
| 6,088,257 | * | 7/2000 | Jeon et al. | 365/145 |

* cited by examiner

Primary Examiner—Richard Elms
Assistant Examiner—Anh Phung
(74) Attorney, Agent, or Firm—Hogan & Hartson, L.L.P.

(57) ABSTRACT

A method is disclosed for driving a memory cell formed of a ferroelectric capacitor FC and a transistor Tr. While maintaining a cell plate line CP at an intermediate voltage level Vcc/2 of a power supply voltage, a bit line BL is precharged to a voltage equal to Vcc/2. Data is read by detecting a change in voltage on the bit line BL which occurs when the bit line BL is released from the precharged state in a period in which word line WL0 is selected. Data is written by changing the voltage on the cell plate line CP in a stepped fashion in the order of Vcc/2, Vcc, 0 V, and Vcc/2, while applying a write voltage to the bit line after releasing the bit line from the precharged state, in a period in which a word line is selected. This method allows a ferroelectric memory cell to be driven at a high speed with low power consumption. Furthermore, the method allows a ferroelectric memory cell to be polarized to a sufficient degree, and thus the ferroelectric memory cell can be driven in a highly reliable fashion.

8 Claims, 7 Drawing Sheets

±Ec : COERCIVE ELECTRIC FIELD
±Pr : RESIDUAL POLARIZATION
Rdf : READ VOLTAGE DIFFERENCE ON A BIT LINE

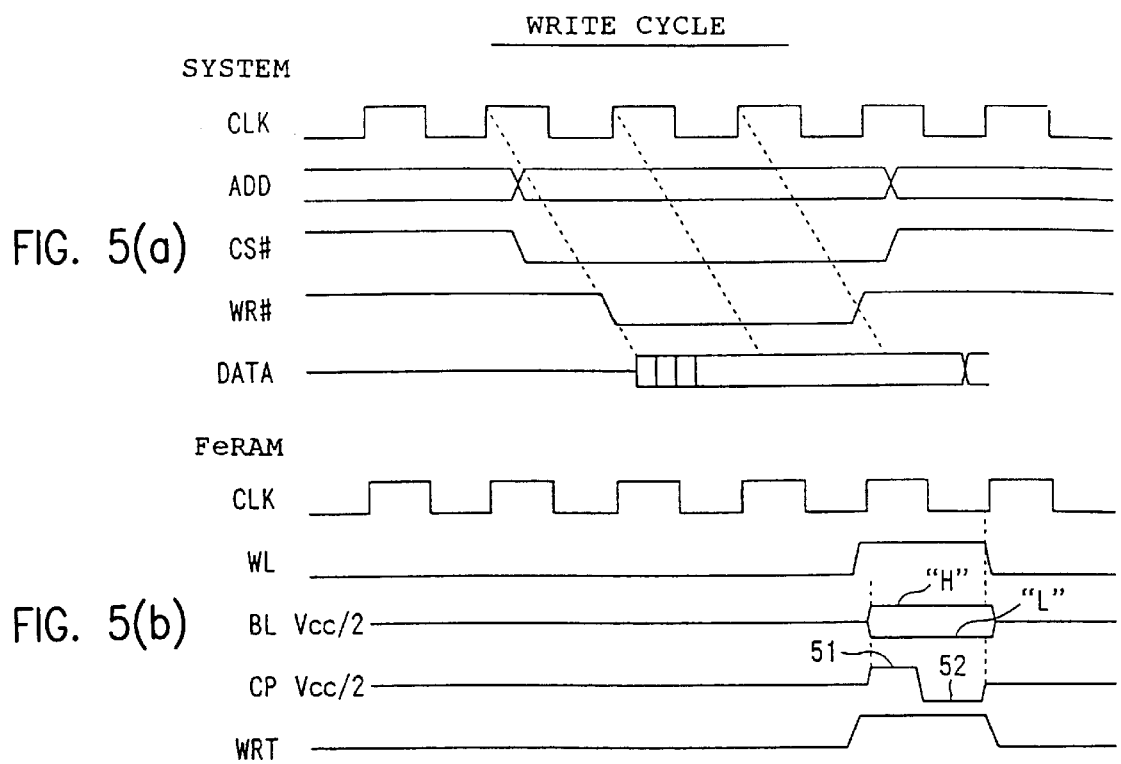
FIG. 5(a)
FIG. 5(b)
FIG. 6
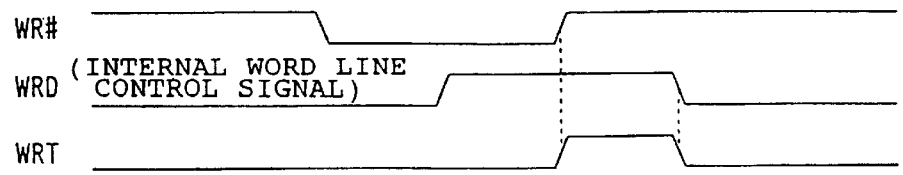
WRT : IN A WRITE CYCLE, SAME TIMING SIGNAL AS WL, ONE CLOCK AFTER A RISING EDGE OF WR#

FIG. 8
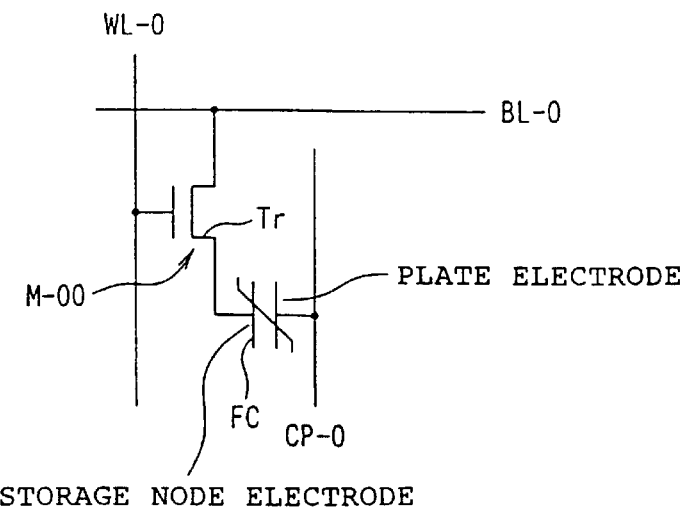
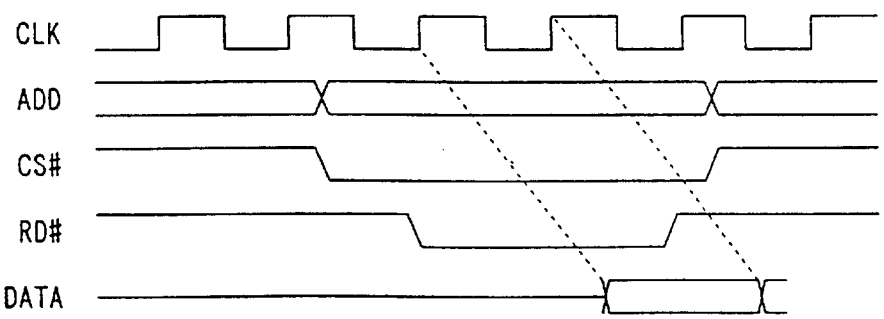
FIG. 9(a)
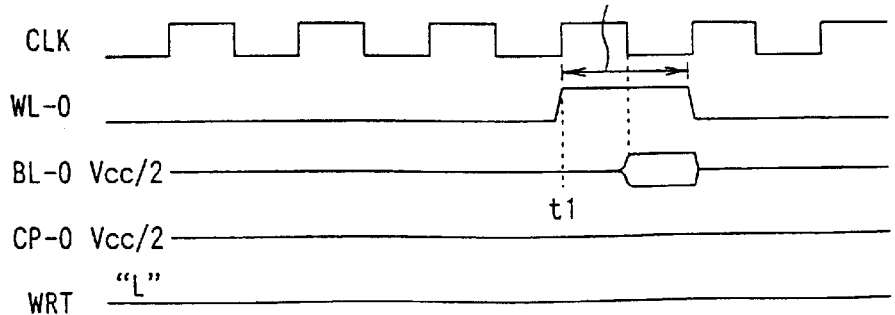
FIG. 9(b)

DRIVE METHOD FOR FERAM MEMORY CELL AND DRIVE DEVICE FOR THE MEMORY CELL

TECHNICAL FIELD

The present invention relates to a memory (FeRAM (ferroelectric RAM)) using a ferroelectric film as a capacitor of a memory cell, and more particularly, to a method and an apparatus for driving a memory cell of a FeRAM at a high speed with low consumption power.

BACKGROUND ART

FIG. 11 is a circuit diagram illustrating the structure of a memory cell of a conventional FeRAM. This memory cell is formed of one ferroelectric capacitor FC and one selection transistor Tr connected to the ferroelectric capacitor FC. For example, an n-channel MOSFET is used as the selection transistor Tr. The gate of the selection transistor Tr is connected to a word line WL, and the drain is connected to a bit line BL. The source of the selection transistor Tr is connected to one electrode (storage node) of the ferroelectric capacitor FC. The other electrode (plate) of the ferroelectric capacitor FC is electrically connected to a cell plate line CP via which a cell plate voltage is supplied.

FIG. 12 illustrates a hysteresis curve of a ferroelectric material. A feature of the ferroelectric memory is that even when there is no voltage difference between the plate and the storage node, that is, even when there is no electric field across the ferroelectric material of the capacitor, there can be a residual dielectric polarization (points a and d in FIG. 12) which allows the ferroelectric capacitor to be nonvolatile.

If the voltage between the plate and the node is increased to a high level, that is, if a high-electric field is applied across the ferroelectric material of the capacitor, dielectric polarization (paraelectric property of the ferroelectric material) increases and becomes substantially saturated at points c or f in FIG. 12. If the electric field across the ferroelectric material is reduced to zero from the saturation region, the residual dielectric polarization remains (point a or d in FIG. 12) after the electric field becomes zero.

As can be seen from FIG. 12, the magnitude of the residual dielectric polarization ±Pr depends on the voltage difference between the plate and the storage node applied when data is written or rewritten into the memory cell. That is, either one of the residual polarization states ±Pr at point a or d can be selected by controlling the direction in which an electric field is applied in the write operation. On the other hand, data can be read using the property that the displacement current, which flows when a pulse is applied, varies depending on the polarization state.

In a precharging cycle, a pair of bit lines is precharged to a ground voltage GND (0 V). During the precharging cycle, a sense amplifier (not shown) is maintained in an inactive state. After that, the bit line is released from the precharged state, and the word line WL is selected. Furthermore, a power supply voltage Vcc is applied to the cell plate CP and the sense amplifier (not shown) is activated.

As a result, the memory cell storing data in a polarization state at point a goes to point f along the hysteresis curve. In this case, a small change in the capacitance of the ferroelectric capacitor FC occurs, and a small voltage appears across the linear capacitor of the bit line BL connected in series with the ferroelectric capacitor FC. As a result, the output voltage is small, that is, low-level data is output.

In the case where the memory cell is in the polarization state d, the memory cell goes to state f and further to state a. In this case, a polarization inversion occurs, and thus a larger amount of charge is output via the bit line when Vcc is applied to the cell plate line CP than is output in the transition from state a. The sense amplifier (not show) performs differential amplification, and thus the voltage on the bit line, that is, the voltage on the storage node electrode also becomes equal to Vcc.

In this case, a large change occurs in the capacitance of the ferroelectric capacitor FC, and a large voltage appears across the linear capacitor of the bit line BL connected in series with the ferroelectric capacitor FC. As a result, a high-level output is obtained.

Thereafter, if the voltage on the cell plate line CP is returned from Vcc to 0 V, the polarization state returns to point a if the initial polarization was at point a, and the polarization state goes to point c if the initial polarization was at point d. In the case where the initial polarization was at point d, the polarization eventually returns to point d from point c when the power supply applied to the cell plate line CP is turned off.

Data is rewritten (written) as follows. In order to rewrite data from polarization state a to polarization state d, Vcc is applied to the bit line BL when Vcc is applied to the cell plate line CP (that is, to the plate electrode). As a result, the polarization state changes in the order a, b, c, and d. On the other hand, when data is to be rewritten from polarization state d to polarization state a, 0 V is applied to the bit line BL. In this case, the polarization state changes in the order d, e, f, and a.

That is, data is written into and read out from the memory cell by changing the voltage on the cell plate line CP connected to the ferroelectric capacitor FC between a high-level voltage and a low-level voltage.

The method of driving a FeRAM memory cell described above is called a cell plate (CP line) driving method. In this driving method, in both writing and reading operations, the voltage of the cell plate line CP is changed in the order 0 V, the power supply voltage Vcc, and 0 V. In this driving method, the voltage difference of the cell plate is substantially maintained at the power supply voltage Vcc, and thus a large enough voltage is applied such as to polarize the ferroelectric material to a sufficient degree.

However, in the conventional method of driving the FeRAM memory cell, it takes a long time to drive the cell plate between 0 V and the power supply voltage Vcc in the read or write operation. Another problem of this method is that large electrical power is consumed when the cell plate is driven between 0V and the power supply voltage Vcc.

In view of the above, it is an object of the present invention to provide a method and an apparatus for driving a FeRAM memory cell in such a manner that a memory cell capacitor of a ferroelectric memory is driven in a novel fashion thereby achieving an increase in the operation speed and a reduction in the power consumption and in such a manner that the memory cell capacitor is polarized to a sufficient degree to write data in a highly reliable fashion.

DISCLOSURE OF THE INVENTION

The present invention provides a method of driving a FeRAM memory cell formed of a capacitor using a ferroelectric film and a switching device, one electrode of the capacitor being connected to a bit line via the switching device, the other electrode of the capacitor being connected to a cell plate line, and a control terminal of the switching device being connected to a word line, the method being characterized in that: data is read from the memory cell by first selecting the word line and then changing the voltage on the bit line over a range centered around an intermediate level of a power supply voltage while maintaining the cell plate line at the intermediate level; and data is written to the memory cell by first selecting the word line and then controlling the voltage on the cell plate line within a range from a low voltage level to a high voltage level while applying a write voltage to the bit line.

In an aspect of the FeRAM memory cell driving method according to the invention, the bit line and the cell plate line are precharged to an intermediate voltage level of the power supply voltage during a period in which the word line is not selected.

In another aspect of the FeRAM memory cell driving method according to the invention, when data is written, the voltage upon the cell plate line is controlled such that the voltage is changed in a stepped fashion in the order of the intermediate voltage level, the high voltage level, the low voltage level, and the intermediate voltage level.

In still another aspect of the FeRAM memory cell driving method according to the invention, when data is written, the cell plate line is controlled in synchronization with a system clock.

The method according to the present invention makes it possible to read, at a high speed, the voltage on the bit line which varies, in the data reading operation, from the intermediate voltage level of the power supply voltage to the high level or low level. On the other hand, in the data writing operation, it is possible to apply a voltage equal to the power supply voltage across the capacitor (ferroelectric material) via the cell plate line such that the capacitor is polarized to a sufficient degree required to store data.

If the bit line and the cell plate line are precharged to the intermediate voltage level of the power supply voltage during a period in which the word line is not selected, it becomes possible to quickly start the read or write operation without a significant delay.

The present invention also provides a FeRAM memory cell driving apparatus comprising at least one memory cell formed of a capacitor using a ferroelectric film and a switching device, one electrode of the capacitor being connected to a bit line via the switching device, the other electrode of the capacitor being connected to a cell plate line, and a control terminal of the switching device being connected to a word line, the FeRAM memory cell driving apparatus further comprising: data reading means for reading data from the memory cell by first selecting the word line and then changing the voltage on the bit line over a range centered around an intermediate level of a power supply voltage while maintaining said cell plate line at the intermediate level; and data writing means for writing data to the memory cell by first selecting the word line and then controlling the voltage on the cell plate line within a range from a low voltage level to a high voltage level while applying a write voltage to the bit line.

In an aspect of the apparatus for driving a FeRAM memory cell according to the present invention, the apparatus further comprises precharging means for precharging the bit line and the cell plate line to an intermediate voltage level of the power supply voltage during a period in which the word line is not selected.

In another aspect of the apparatus for driving a FeRAM memory cell according to the present invention, the data writing means controls the voltage upon the cell plate line such that the voltage is changed in a stepped fashion in the order of the intermediate voltage level, the high voltage level, the low voltage level, and the intermediate voltage level.

In still another aspect of the apparatus for driving a FeRAM memory cell according to the present invention, the data writing means controls the cell plate line in synchronization with a system clock.

In the apparatus according to the present invention, the data reading means can read, at a high speed, the voltage on the bit line which varies, in the data reading operation, from the intermediate voltage level of the power supply voltage to the high level or low level. On the other hand, in the data writing operation, the data writing means applies the voltage equal to the power supply voltage across the capacitor (ferroelectric material) via the cell plate line such that the capacitor is polarized to a sufficient degree required to store data.

When the apparatus includes the precharging means, it becomes possible for the data reading means and the data writing means to quickly start the read or write operation without a significant delay.

BRIEF DESCRIPTION OF THE DRAWINGS

FIGS. 5(a) and 5(b) are timing charts illustrating an operation in a write cycle,(writing operation) according to the method of driving the FeRAM memory cell of the present invention.

FIG. 6 is a waveform diagram defining some signals shown in FIG. 3 or 5.

FIG. 8 is diagram illustrating, in an enlarged fashion, the memory cell shown in FIG. 7.

FIGS. 9(a) and 9(b) are timing charts illustrating a read operation associated with various parts of the FeRAM shown in FIG. 7 and also associated with various parts of a system.

BEST MODE FOR CARRYING OUT THE INVENTION

Embodiments of the present invention are described below with reference to the drawings.

Figure 1:
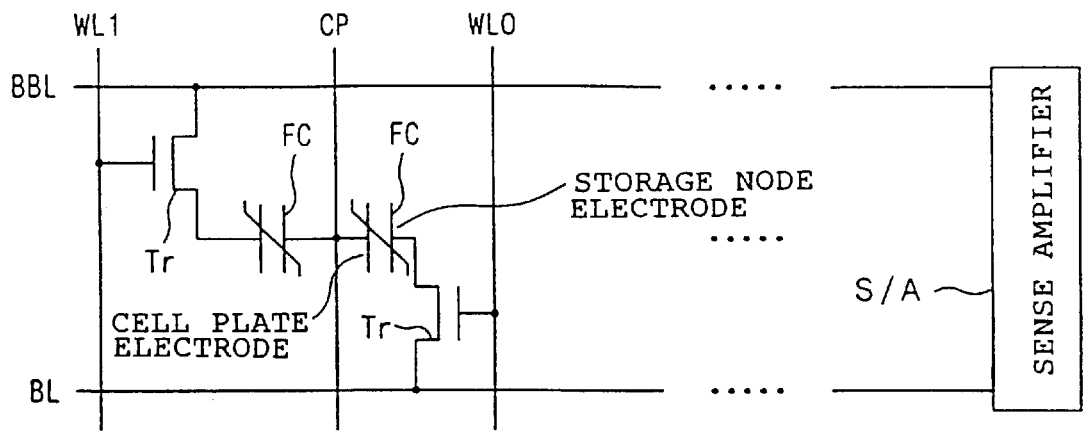
FIG. 1 is a circuit diagram of a memory cell and a peripheral circuit, illustrating a method of driving a FeRAM according to the present invention.

FIG. 1 is a circuit diagram illustrating a memory cell and a peripheral circuit. Referring to this figure, a method of driving a FeRAM according to the present invention is described below. In this memory cell driving method, a pair of bit lines (BL, BBL) are precharged to Vcc/2. Furthermore, in this driving method, the cell plate (cell plate line CP) is fixed to an initial voltage equal to Vcc/2.

As shown in FIG. 1, each FeRAM memory cell is formed of one transistor and one capacitor (this structure is called a 1T1C structure), and one datum is treated by one memory cell having such a structure.

More specifically, the memory cell includes, as shown in FIG. 1, a capacitor FC using a ferroelectric film and a MOS transistor Tr serving as a switching device. One electrode (storage node electrode) of the capacitor FC is connected, via the MOS transistor Tr, to a bit line BL (or complimentary line BBL) via which a voltage corresponding to data is supplied. The other electrode (cell plate electrode) of the capacitor FC is connected to the cell plate line CP. The gate of the NMOS transistor Tr is connected to a word line WL (or WL1) such that the conduction of the NMOS transistor Tr is controlled by a voltage applied to the word line WL. The pair of bit lines (BL, BBL) are connected to a sense amplifier S/A.

Figure 2:
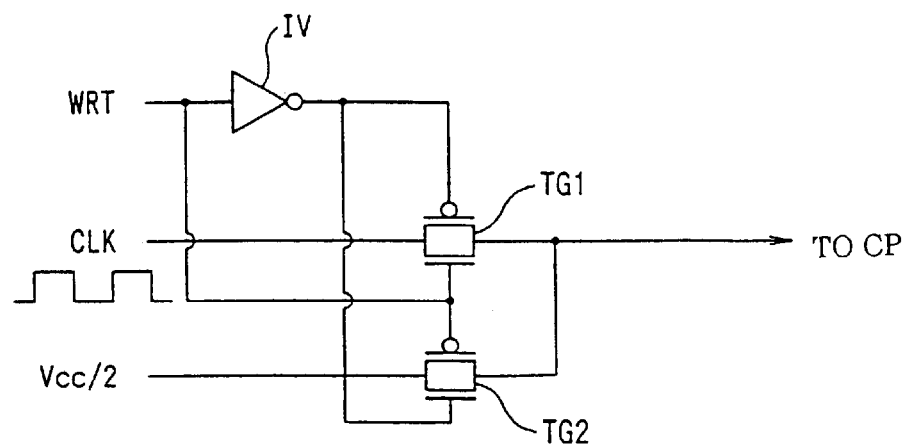
FIG. 2 is a circuit diagram illustrating an example of a cell plate signal control circuit required by the method according to the present invention.

FIG. 2 is a circuit diagram illustrating an example of a cell plate signal control circuit used in the present invention. That is, FIG. 2 illustrates a technique for supplying a voltage to the cell plate line CP according to the memory cell driving method of the present invention.

As shown in FIG. 2, this cell plate signal control circuit includes an inverter IN, a transfer gate TG1, and a transfer gate TG2. This cell plate signal control circuit operates as follows.

A clock signal CLK of the FeRAM system is output via the transfer gate TG1. A signal with a voltage of Vcc/2 is output via the transfer gate TG2. The transfer gates TG1 and TG2 are activated in a complementary fashion such that the output of either one of the transfer gates is transmitted as a cell plate signal over the cell plate line CP.

The n-channel gate element of the transfer gate TG1 and the p-channel gate element of the transfer gate TG2 are both controlled by a signal WRT (which will be described later). The p-channel gate element of the transfer gate TG1 and the n-channel gate element of the transfer gate TG2 are both controlled by an inverted signal obtained by inverting the signal WRT using the inverter IV.

Figure 3A:
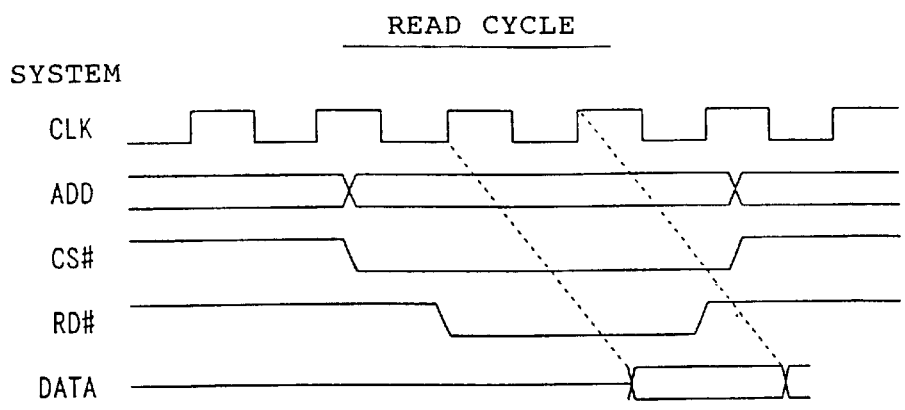
FIGS. 3(a) and 3(b) are timing charts illustrating an operation in a read cycle (read operation) according to the method of driving the FeRAM memory cell of the present invention.
Figure 3B:
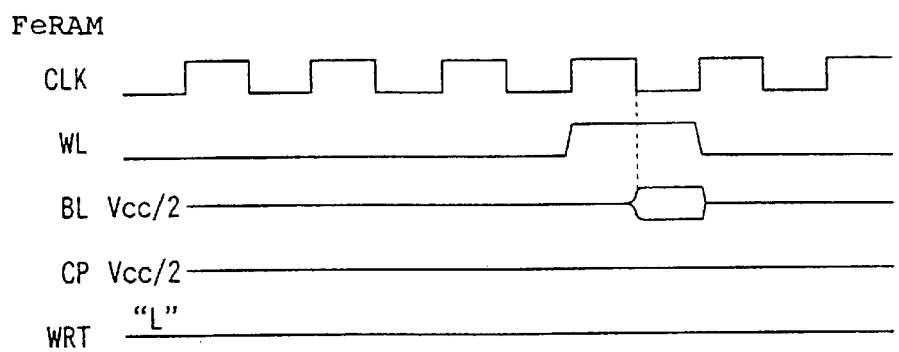

FIGS. 3(*a*) and 3(*b*) are timing charts illustrating an operation in a read cycle (read operation) according to the method of driving the FeRAM memory cell of the present invention. Referring to FIGS. 1 and 2, the reading operation is described below.

The FeRAM according to the present invention is used as a memory in a system such as a computer (not shown), and data is read and written in response to a request issued by the system. Therefore, the reading operation of the FeRAM is described below together with the associated operation of the system.

In the system, as shown in FIG. 3(*a*), an address ADD is supplied to a memory system (FeRAM) in synchronization with the system clock CLK. When a chip select signal CS# is in an active state, a read control signal RD# is activated thereby acquiring data from the FeRAM as will be described later.

In the FeRAM, as shown in FIG. 3(*b*), the bit line BL and the cell plate line CP are precharged to a voltage equal to Vcc/2, before the word line WL is selected. When the word line WL is activated in synchronization with the system clock, the bit line BL is released from the precharged state during the period in which the word line WL is in the active state. Note that, in the cell plate signal control circuit shown in FIG. 2, the signal WRT is maintained at the low level as shown in FIG. 3(*b*) and thus the voltage on the cell plate line CP is maintained at Vcc/2.

When the bit line BL is released from the precharged state, the storage node electrode of the capacitor FC is electrically connected to the bit line BL. As a result, it becomes possible for the sense amplifier S/A to amplify, in a complementary fashion, a voltage difference which is developed between the bit lines BL and BBL by a change in bit line capacitance corresponding to polarization state of the cell capacitor FC.

Figure 4:
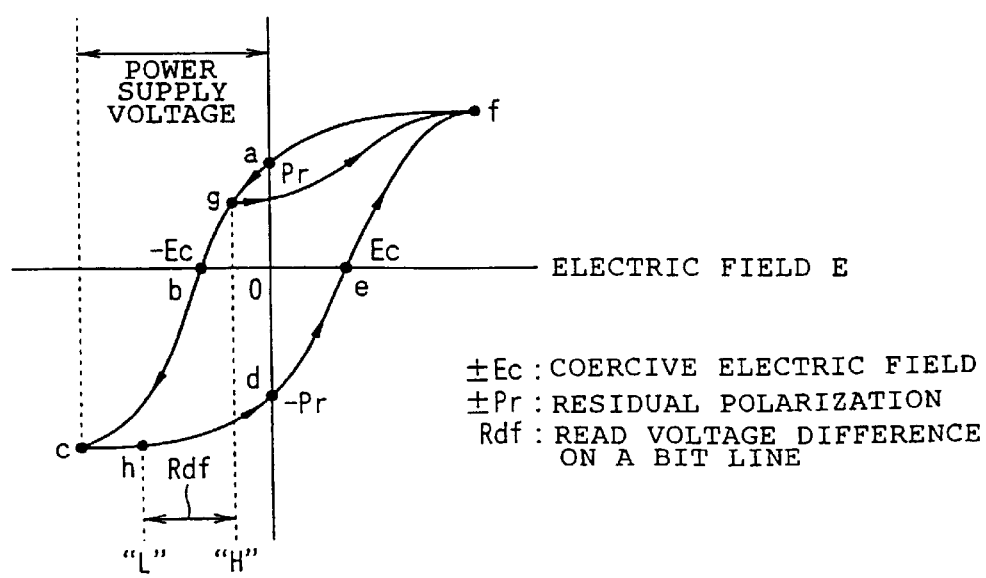
FIG. 4 is a hysteresis curve diagram illustrating polarization of the ferroelectric material of a cell capacitor FC during the data reading operation.

FIG. 4 is a hysteresis curve diagram illustrating polarization of the ferroelectric material of the cell capacitor FC during the data reading operation.

When the ferroelectric material of the capacitor FC is in polarization state a, the bit line BL is released from the precharged state, a change in the bit line capacitance corresponding to the polarization state a causes the ferroelectric material to go to polarization state g. Thereafter, if the voltage on the bit line BL becomes equal to Vcc as a result of amplification by the sense amplifier S/A, the polarization goes to point f. When the word line WL is inactivated, the polarization returns to point a.

On the other hand, when the ferroelectric material of the capacitor FC is in polarization state d, if the precharging upon the bit line BL is terminated, a change in the bit line capacitance corresponding to the polarization state d causes the ferroelectric material to go to polarization state h. Thereafter, if the voltage on the bit line BL becomes equal to 0 V as a result of amplification by the sense amplifier S/A, the polarization goes to point c. When the word line WL is inactivated, the polarization returns to point d.

FIGS. 5(*a*) and 5(*b*) are timing charts illustrating an operation in a write cycle (writing operation) according to the method of driving the FeRAM memory cell of the present invention. Referring to FIGS. 1 and 2, the writing operation is described below.

In the system, as shown in FIG. 5(*a*), an address ADD is supplied to the memory system (FeRAM) in synchronization with the system clock CLK. When a chip select signal CS# is in an active state, a write control signal WR# is activated thereby supplying data (corresponding to a high or low level on the bit line BL shown in FIG. 5(*b*)) to the FeRAM.

In the FeRAM, as shown in FIG. 5(*b*), the bit line BL and the cell plate line CP are precharged to a voltage equal to Vcc/2 before the word line WL is selected. When the word line WL is activated in synchronization with the system clock, the bit line BL is released from the precharged state during a period in which the word line WL is in the active state, and data is sent from the system over the bit line BL. In the period in which the word line WL is in the active state, the signal WRT supplied from the cell plate signal control circuit shown in FIG. 2 is changed from the low level to the high level (FIG. 5(*b*)).

FIG. 6 is a timing chart associated with the signal WRT. Thus, the cell plate line CP has a voltage varying in accordance with the clock signal CLK.

When the bit line BL is released from the precharged state, the storage node electrode of the capacitor FC is electrically connected to the bit line BL, and data (voltage) to be written is applied to the storage node electrode. On the other hand, the voltage on the cell plate CP changes from Vcc/2 to a voltage equal to the power supply voltage Vcc (51 in FIG. 5(*b*)). Herein, data is written into the cell capacitor FC (polarization transition occurs). After that, the voltage on the cell plate CP is changed to 0 V (52 in FIG. 5(*b*)), and polarization goes to a final state (the operation of writing data is completed).

Referring to FIG. 4, polarization of the ferroelectric material of the cell capacitor FC which occurs in the data reading operation is described. That is, data is rewritten (written) in the manner described below.

First, the power supply voltage Vcc is applied to the cell plate line CP (that is, the plate electrode) as represented by 51 in FIG. 5(*b*). When it is desired to rewrite data so as to change the polarization state from point a to point d in FIG. 4, the power supply voltage Vcc ("H" level in FIG. 5(*b*)) is applied to the bit line BL, and the voltage on the cell plate line CP is changed to 0 V (52 in FIG. 5(*b*)). As a result, the polarization changes in the order a, b, c, and d. On the other hand, when it is desired to rewrite data such as to change the polarization state from point d to point a in FIG. 4, 0 V ("L" level in FIG. 5(*b*)) is applied to the bit line BL, and the voltage on the cell plate line CP is changed to Vcc (51 in FIG. 5(*b*)). As a result, the polarization changes in the order d, e, f, and a.

As described above, the Vcc/2-driving method employed in the memory cell driver according to the present embodiment makes it possible to drive the memory at a high speed with low power consumption. Furthermore, it is possible to achieve an operation mode in which no polarization inversion occurs in the data reading operation, thereby preventing degradation in the ferroelectric film. Only in the data writing operation, the voltage of the cell plate line CP is changed in the order Vcc/2, the power supply voltage Vcc, 0 V, and Vcc/2, thereby writing data.

Thus, the method according to the present embodiment allows the cell plate line CP to be driven over the range of Vcc to 0 V such that the memory cell is polarized to a sufficient degree. Thus, it becomes possible to reduce the memory cell size and also reduce the operating voltage. Furthermore, this method can be advantageously employed in the single transistor/single capacitor (1T1C) structure.

Figure 7:
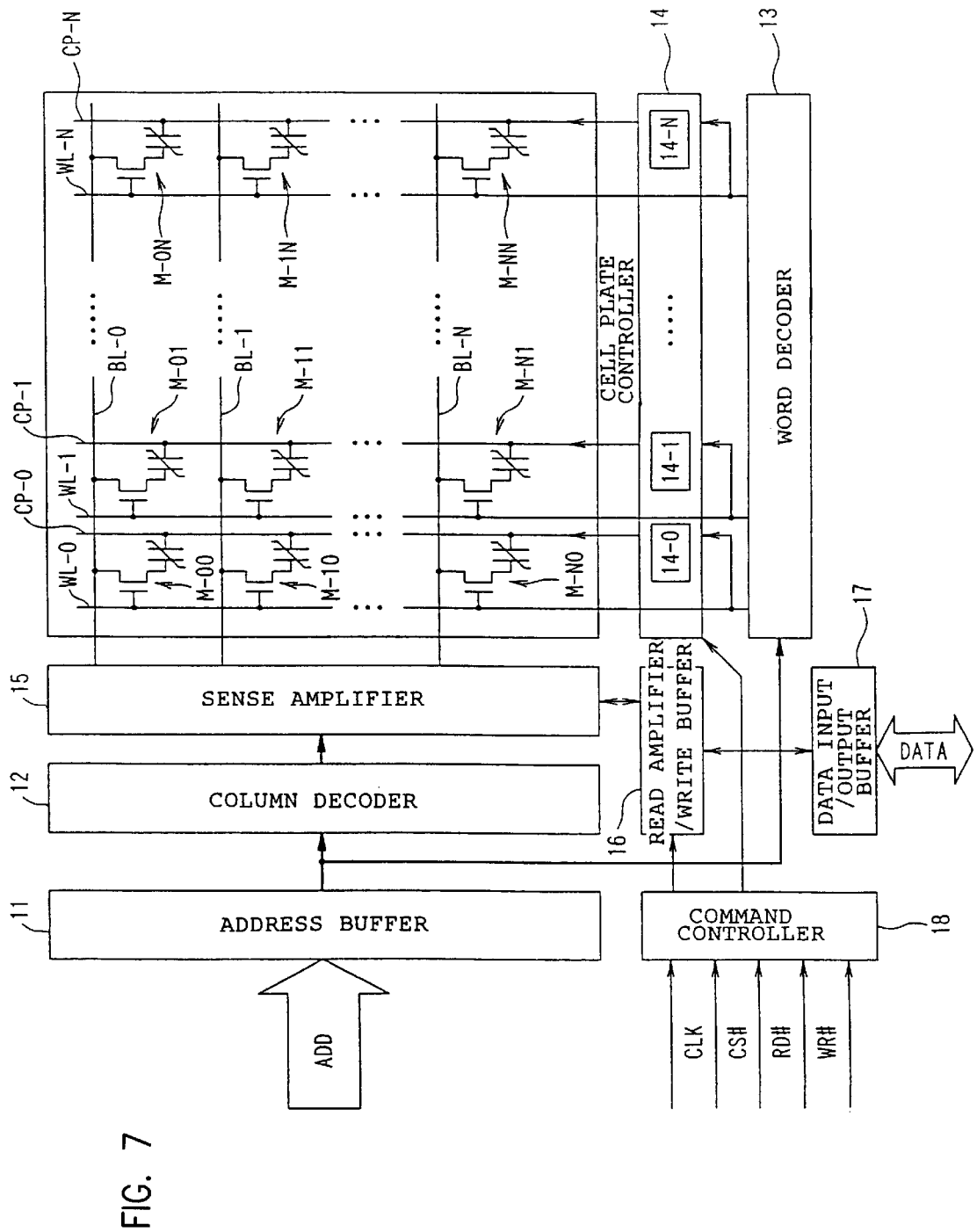
FIG. 7 is a block diagram illustrating an example of a general configuration of a FeRAM including a memory cell driver according to the present invention.

Referring now to FIG. 7, an example of a general configuration of a FeRAM including a memory cell driver according to the above-described memory cell driving method of the present invention is described.

As shown in FIG. 7, this FeRAM includes a memory cell array including a plurality of memory cells M-00 to M-NN arranged in the form of a two-dimensional matrix. Bit lines BL-0 to BL-N extending in a horizontal direction in FIG. 7 are disposed at locations corresponding to the memory cells M-00 to M-NN, and word lines WL-0 to WL-N and cell plate lines CP-0 to CP-N are disposed in a vertical direction in FIG. 7.

The memory cells M-00 to M-NN are similar in structure to one another. Thus, the memory cell structure is described below with reference to, by way of example, the memory cell M-00 shown in FIG. 8. The memory cell M-00 includes, as shown in FIG. 8, a capacitor FC with a ferroelectric film for storing a charge and an NMOS transistor Tr serving as a switching device for storing or removing a charge into or from the capacitor FC. One electrode of the capacitor FC is connected to the bit line BL-0 via the NMOS transistor Tr, and the other electrode of the capacitor FC is connected to the cell plate line CP-0. The gate of the NMOS transistor Tr is connected to the word line WL-0.

The FeRAM also includes a memory cell driver according to the present invention for selecting one of memory cells M-00 to M-NN and reading or writing data from or into the selected memory cell. The memory cell driver is described in further detail below. As shown in FIG. 7, the memory cell driver includes: an address buffer 11 for temporarily storing data representing an address ADD received from a system such as a computer (not shown); a column decoder 12 for selecting one of bit lines BL-0 to BL-N in accordance with the address indicated by the data stored in the address buffer 11 and for supplying a voltage, which will be described later, to the selected bit line; a word decoder 13 for selecting one of word lines WL-0 to WL-N in accordance with the address indicated by the data stored in the address buffer 11 and for supplying a voltage, which will be described later, to the selected word line; cell plate signal control circuits 14-1 to 14-N similar to the cell plate signal control circuit shown in FIG. 2; a cell plate signal controller 14 for supplying a voltage (cell plate signal), which will be described later, to the respective cell plates CP-0 to CP-N; and a sense amplifier 15 for reading a weak data signal from a selected memory cell.

The memory cell driver further includes: a read amplifier/write buffer 16 for amplifying read data and also temporarily storing data to be written; a data input/output buffer 17 for temporarily storing read data or data to be written; and a command controller 18 for generating and outputting a control signal for controlling operation timing of various parts in accordance with a clock CLK, a chip select signal CS#, a read control signal RD#, and a write control signal WR#, which are supplied from the system.

In this memory cell driver, the precharging means corresponds to the cell plate line controller 14 and the sense amplifier 15. The data reading means corresponds to the column decoder 12, the word decoder 13, and the sense amplifier 15. The data writing means corresponds to the column decoder 12 the word decoder 13, and the cell plate line controller 14.

The operation of the FeRAM configured in the above-described manner is described below with reference to FIGS. 7 to 10.

The FeRAM shown in FIG. 7 is used as a memory in a system such as a computer (not shown), and data is read and written in response to a request issued by the system. Therefore, the reading operation of the FeRAM is described below together with the associated operation of the system.

In the system, as shown in FIG. 9(*a*), an address ADD is generated in synchronization with the system clock CLK and supplied to the address buffer 11 shown in FIG. 7. The system also supplies the clock pulse CLK, the chip select signal CS#, and the read control signal RD# to the command controller 18. In the system, as shown in FIG. 9(*a*), when the chip select signal CS# is in an active state, the read control signal RD# is activated thereby acquiring read data from the FeRAM as will be described below.

In the following description of the read operation, it is assumed that data is read from a memory cell M-00 indicated by the address ADD in the address buffer 11.

In this case, the address corresponding to the memory cell M-00, stored in the address buffer 11, is separated by the column decoder 12 and the word decoder 13 such that the column decoder 12 decodes the address into a column address and the word decoder 13 decodes the address into a word address. As a result, for example, a bit line BL-0 is selected by the column decoder 12, and a word line WL-0 is selected by the word decoder 13. Furthermore, a cell plate, line CP-0 is selected by the cell plate signal controller 14.

Herein, as shown in FIG. 9(*b*), before word line WL-0 is selected (before the reading operation), the voltages of the bit line BL-0 and the cell plate CP-0 are precharged to Vcc/2 by the sense amplifier 15 and the cell plate line control circuit 14-0. If the word line WL-0 is activated at time t1 in synchronization with the clock CLK, the bit line BL-0 is released from the precharged state during a period T1 in which the word line WL-0 is in the active state. Herein, in the cell plate signal control circuit 14-0 of the cell plate signal controller 14, the signal WRT is maintained at the low level (refer to FIG. 2), and thus the voltage on the cell plate line CP-0 is maintained at Vcc/2 as shown in FIG. 9(b).

If the bit line BL-0 is released from the precharged state as described above, the bit line BL-0 and the storage node electrode of the capacitor CP are electrically connected to each other. As a result, the sense amplifier 15 amplifies a voltage developed upon the bit line BL-0 depending upon a change in bit line capacitance corresponding to the polarization state of the cell capacitor FC. The amplified voltage is output as read data via the read amplifier/write buffer 16 and the data input/output buffer 17. The read data is acquired by the system as described earlier.

Referring to FIG. 4, polarization of the ferroelectric material of the cell capacitor FC which occurs in the data reading operation is described.

When the ferroelectric material of the capacitor FC is in polarization state a, the bit line BL-0 is released from the precharged state, a change in the bit line capacitance corresponding to the polarization state a causes the ferroelectric material to go to polarization state g. Thereafter, if the voltage on the bit line BL becomes equal to Vcc as a result of amplification by the sense amplifier 15, the polarization goes to point f. When the word line WL-0 is inactivated, the polarization returns to point a.

On the other hand, when the ferroelectric material of the capacitor FC is in polarization state d, if the bit line BL-0 is released from the precharged state, a change in the bit line capacitance corresponding to the polarization state d causes the ferroelectric material to go to polarization state h. Thereafter, if the voltage on the bit line BL-0 becomes equal to 0 V as a result of amplification by the sense amplifier 15, the polarization goes to point c. When the word line WL-0 is inactivated, the polarization returns to point d.

The write operation of the FeRAM is described below. Herein, by way of example, it is assumed that data is written into a memory cell M-11.

Figure 10A:
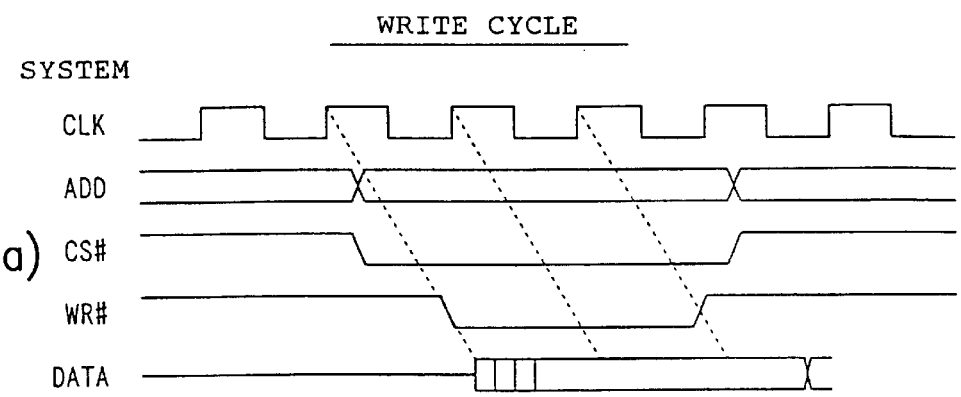
FIGS. 10(a) and (b) are timing charts illustrating a write operation associated with various parts of the FeRAM shown in FIG. 7 and also associated with various parts of the system.

In this case, as shown in FIG. 10(a), the system generates an address ADD corresponding to the memory cell M-11 in synchronization with the system clock CLK. The generated address ADD is supplied to the address buffer 11 shown in FIG. 7. Furthermore, in the system, as shown in FIG. 10(a), the write control signal WR# is activated in an active period of the chip select signal CS#, and data (corresponding to "H" or "L" level applied to the bit line BL shown in FIG. 10(b)) to be written is supplied to the FeRAM. When the address is supplied to the address buffer 11, the address is separated by the column decoder 12 and the word decoder 13, such that the column decoder 12 decodes the address into a column address and the word decoder 13 decodes the address into a word address. As a result, for example, a bit line BL-1 is selected by the column decoder 12, and a word line WL-1 is selected by the word decoder 13. Furthermore, a cell plate line CP-1 is selected by the cell plate signal controller 14.

Figure 10B:
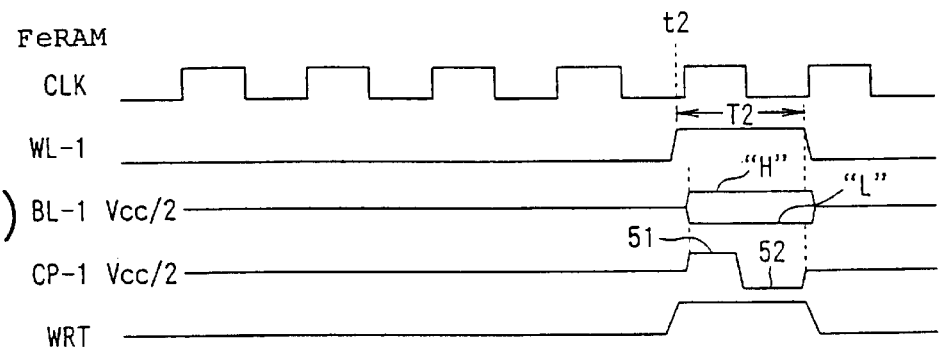
Figure 11:
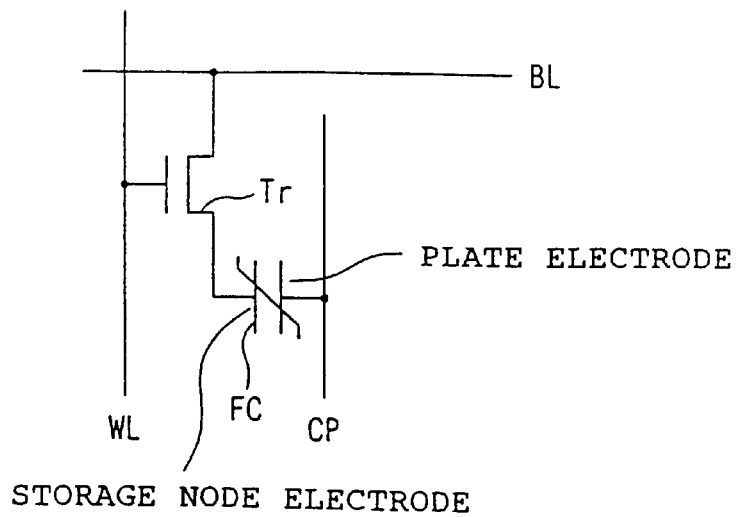
FIG. 11 is a circuit diagram illustrating the structure of a memory cell of a conventional FeRAM, provided for illustrating a conventional method for driving a FeRAM memory cell.
Figure 12:
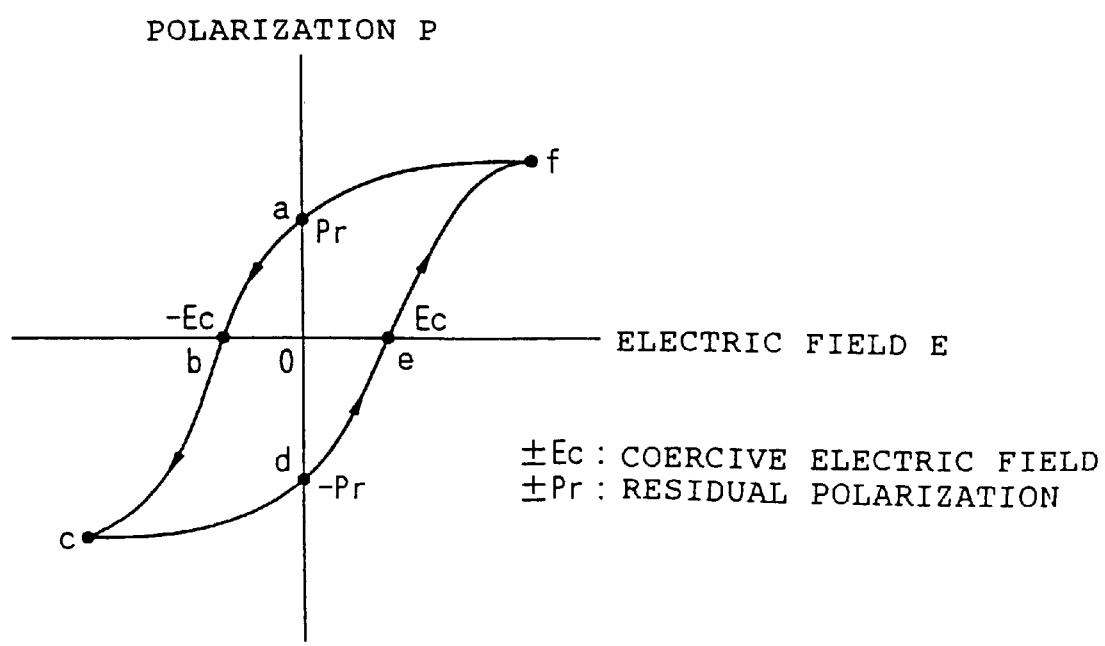
FIG. 12 illustrates a hysteresis curve of a ferroelectric material.

As shown in FIG. 10(b), the bit line BL-1 and the cell plate line CP-1 are precharged to a voltage equal to Vcc/2 by the sense amplifier 15 and the cell plate line control circuit 14-0, respectively, before the word line WL-1 is selected. If the word line WL-1 is activated at time t2 in synchronization with the clock CLK, the bit line BL-1 is released from the precharged state during a period T2 in which the word line WL-1 is in the active state, and data, which has been supplied from the system and stored into the read amplifier/ write buffer 16 via the data input/output buffer 17, is transmitted over the bit line BL-1 via the sense amplifier 15.

In the period T2 in which the word line WL-1 is in the active state, the signal WRT supplied to the cell plate signal control circuit 14-1 of the cell plate signal controller 14 changes from the low level to the high level, and thus a clock signal CLK is output from the cell plate signal control circuit 14-1 (FIG. 2) and supplied to the cell plate line CP-1. As a result, during the period T2, the cell plate line CP-1 has a voltage varying in accordance with the clock signal CLK, as shown in FIG. 10(b).

When the bit line BL-1 is released from the precharged state, the bit line BL-1 and the storage node electrode of the capacitor FC are electrically connected to each other, and data (voltage) to be written is applied to the storage node electrode via the bit line BL-1. On the other hand, the voltage on the cell plate CP-1 changes from Vcc/2 to a voltage equal to the power supply voltage Vcc (51 in FIG. 10(b)). Herein, data is written into the cell capacitor FC (polarization transition occurs). After that, the voltage on the cell plate CP-1 is changed to 0 V (52 in FIG. 5(b)), and polarization goes to a final state (the operation of writing data is completed).

Referring to FIG. 4, polarization of the ferroelectric material of the cell capacitor FC which occurs in the data writing operation is described.

First, the power supply voltage Vcc is applied to the cell plate line CP-1 (that is, the plate electrode) as represented by 51 in FIG. 10(b). When it is desired to rewrite data such as to change the polarization state from point a to point d in FIG. 4, the power supply voltage Vcc ("H" level in FIG. 10(b)) is applied to the bit line BL-1, and the voltage on the cell plate line CP-1 is changed to 0 V (52 in FIG. 10(b)). As a result, the polarization chances in the order a, b, c, and d.

On the other hand, when it is desired to rewrite data such as to change the polarization state from point d to point a in FIG. 4, 0 V ("L" level in FIG. 10(b)) is applied to the bit line BL-1, and the voltage on the cell plate line CP is changed to Vcc (51 in FIG. 10(b)). As a result, the polarization changes in the order d, e, f, and a.

As described above, the Vcc/2-driving method employed in the memory cell driver according to the present embodiment makes it possible to drive the memory at a high speed with low power consumption. Furthermore, it is possible to achieve an operation mode in which no polarization inversion occurs in the data reading operation, thereby preventing degradation in the ferroelectric film. Only in the data writing operation, the voltage of the cell plate line CP is changed in the order Vcc/2, the power supply voltage Vcc, 0 V, and the Vcc/2, thereby writing data.

Thus, the memory cell driver according to the present embodiment is capable of driving the cell plate lines CP-0 to CP-N over the range of Vcc to 0 V. This allows the memory cells to be polarized to a sufficient degree. Thus, it becomes possible to reduce the memory cell size and also reduce the operating voltage. Furthermore, this technique can be advantageously employed in the single transistor/single capacitor (1T1C) structure.

Industrial Applicability

As described above, the invention provides a method of driving a FeRAM memory cell, capable of reading, at a high speed, the voltage on a bit line which varies, in the data reading operation, from an intermediate voltage level of the power supply voltage to a high level or a low level. On the other hand, in the data writing operation, it is possible to apply a voltage equal to the power supply voltage across the capacitor (ferroelectric material) via the cell plate line such that the capacitor is polarized to a sufficient degree required to store data. Thus, it becomes possible to reduce the memory cell size and also reduce the operating voltage. Furthermore, this technique can be advantageously employed in the single transistor/single capacitor (1T1C) structure.

The present invention also provides an apparatus for driving a FeRAM memory cell in which the data reading means reads, at a high speed, the voltage on a bit line which varies, in the data reading operation, from an intermediate voltage level of the power supply voltage to a high level or low level. On the other hand, in the data writing operation, the data writing means applies a voltage equal to the power supply voltage across the capacitor (ferroelectric material) via a cell plate line such that the capacitor is polarized to a sufficient degree required to store data. Thus, the apparatus according to the present invention allows a reduction in the memory cell size and also a reduction in the operating voltage. Furthermore, this technique can be advantageously employed in the single transistor/single capacitor (1T1C) structure.

What is claimed is:

1. A method of driving a FeRAM memory cell formed of a capacitor using a ferroelectric film and a switching device, one electrode of said capacitor being connected to a bit line via said switching device, the other electrode of said capacitor being connected to a cell plate line, and a control terminal of said switching device being connected to a word line, said method being characterized in that:

data is read from said memory cell by first selecting said word line and then changing the voltage on said bit line over a range centered around an intermediate level of a power supply voltage while maintaining said cell plate line at said intermediate level; and data is written to said memory cell by first selecting said word line and then controlling the voltage on said cell plate line within a range from a low voltage level to a high voltage level while applying a write voltage to said bit line.

2. A method of driving a FeRAM memory cell according to claim 1, wherein said bit line and said cell plate line are precharged to an intermediate voltage level of the power supply voltage during a period in which said word line is not selected.

3. A method of driving a FeRAM memory cell according to claim 1 or 2, wherein when data is written, the voltage upon the cell plate line is controlled such that said voltage is changed in a stepped fashion in the order of the intermediate voltage level, the high voltage level, the low voltage level, and the intermediate voltage level.

4. A method of driving a FeRAM memory cell according to claim 1 or 2 wherein when data is written, said cell plate line is controlled in synchronization with a system clock.

5. A FeRAM memory cell driving apparatus comprising at least one memory cell formed of a capacitor using a ferroelectric film and a switching device, one electrode of said capacitor being connected to a bit line via said switching device, the other electrode of said capacitor being connected to a cell plate line, and a control terminal of said switching device being connected to a word line, said FeRAM memory cell driving apparatus further comprising:

data reading means for reading data from said memory cell by first selecting said word line and then changing the voltage on said bit line over a range centered around an intermediate level of a power supply voltage while maintaining said cell plate line at said intermediate level; and data writing means for writing data to said memory cell by first selecting said word line and then controlling the voltage on said cell plate line within a range from a low voltage level to a high voltage level while applying a write voltage to said bit line.

6. An apparatus for driving a memory cell of a FeRAM according to claim 5, further comprising precharging means for precharging said bit line and said cell plate line to an intermediate voltage level of the power supply voltage during a period in which said word line is not selected.

7. An apparatus for driving a memory cell of a FeRAM according to claim 5 or 6, wherein said data writing means controls the voltage upon the cell plate line such that said voltage is changed in a stepped fashion in the order of the intermediate voltage level, the high voltage level, the low voltage level, and the intermediate voltage level.

8. An apparatus for driving a memory cell of a FeRAM according to claim 5 or 6 wherein said data writing means controls said cell plate line in synchronization with a system clock.

* * * * *